(12) United States Patent
Kwak

(10) Patent No.: US 8,665,191 B2
(45) Date of Patent: Mar. 4, 2014

(54) ORGANIC LIGHT EMITTING DISPLAY

(75) Inventor: Won-Kyu Kwak, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1235 days.

(21) Appl. No.: 12/173,085

(22) Filed: Jul. 15, 2008

(65) Prior Publication Data
US 2009/0108738 A1    Apr. 30, 2009

(30) Foreign Application Priority Data

Oct. 24, 2007  (KR) .................. 10-2007-0107233

(51) Int. Cl.
*G09G 3/32*    (2006.01)
(52) U.S. Cl.
USPC ................. 345/82; 349/40; 257/355
(58) Field of Classification Search
USPC ............. 257/355–363; 349/40; 345/82–83; 315/169.1–169.4
See application file for complete search history.

(56) References Cited

U.S. PATENT DOCUMENTS

| | | | | |
|---|---|---|---|---|
| 6,084,759 A | * | 7/2000 | Hansson et al. | 361/111 |
| 2007/0138504 A1 | * | 6/2007 | Kim et al. | 257/184 |

FOREIGN PATENT DOCUMENTS

| KR | 10-0311082 B1 | 4/1998 |
|---|---|---|
| KR | 10-0228520 B1 | 8/1999 |
| KR | 2002-0002002 | 1/2002 |
| KR | 2002-0062804 | 7/2002 |
| KR | 10-2007-0016602 | 2/2007 |
| KR | 1020070090119 A | 9/2007 |

OTHER PUBLICATIONS

Machine translation of KR 10-1998-0012280.*
Korean Patent Abstracts, Publication No. 1020020002002 A; Date of Publication: Jan. 9, 2002; in the name of Chang Yong Kang et al.
Korean Patent Abstracts, Publication No. 1020020062804 A; Date of Publication: Jul. 31, 2002; in the name of Steven Howard Voldman.
Korean Patent Abstracts, Publication No. 1020070016602 A; Date of Publication: Feb. 8, 2007; in the name of Dae Yang Bak.
KIPO Office action dated Feb. 2, 2009, for priority Korean application 10-2007-0107233.

* cited by examiner

*Primary Examiner* — Michael Pervan
(74) *Attorney, Agent, or Firm* — Christie, Parker & Hale, LLP

(57) ABSTRACT

An organic light emitting display. The organic light emitting display includes a display unit, a scan driver, a data driver, a pad unit including a plurality of pads for transmitting driving power or driving signals to at least one of the display unit, the scan driver, and the data driver, and a protective circuit unit coupled between the pad unit and at least one of the display unit, the scan driver, or the data driver. The protective circuit unit includes a semiconductor layer, insulating layers on the semiconductor layer, and a conductive layer on the insulating layer. One region of the conductive layer that overlaps the semiconductor layer is physically disconnected to create two adjacent ends that are coupled to each other through the semiconductor layer. The two adjacent ends of the disconnected conductive layer have recesses and protrusions.

16 Claims, 7 Drawing Sheets

ORGANIC LIGHT EMITTING DISPLAY

CROSS-REFERENCE TO RELATED APPLICATIONS

This application claims priority to and the benefit of Korean Patent Application No. 10-2007-0107233, filed on Oct. 24, 2007, in the Korean Intellectual Property Office, the entire content of which is incorporated herein by reference.

BACKGROUND OF THE INVENTION

1. Field of the Invention

The present invention relates to an organic light emitting display, and more particularly to, an electrostatic discharge (ESD) protection circuit of an organic light emitting display.

2. Discussion of Related Art

In general, an organic light emitting display includes a display unit for displaying images and a driving circuit unit for driving the display unit.

The display unit includes a plurality of pixels positioned at the crossing regions between scan lines and data lines. The display unit displays images that correspond to scan signals and data signals supplied from the scan lines and the data lines.

The driving circuit unit supplies a driving power source and/or a driving signal to the display unit. Therefore, the driving circuit unit includes a scan driver for supplying the scan signals, a data driver for supplying the data signals, a timing controller for controlling the scan driver and the data driver, and a power source supply unit for supplying a pixel power source.

In the organic light emitting display, the display unit is formed on a display panel. The driving circuit unit can be formed on the display panel or a printed circuit board (PCB) electrically coupled with the display panel through a pad unit, or can be dispersed on the display panel and the PCB.

For example, the display unit, the scan driver, and the data driver are formed on the display panel of the organic light emitting display, and the timing controller and the power source supply can be mounted on the PCB that is electrically coupled with the display panel through the pad unit.

Coupling wiring lines for supplying the driving power source and/or the driving signal supplied from the pad unit are formed between the components (such as the display unit, the scan driver, and the data driver) formed on the pad unit and the display panel.

However, the coupling wiring lines can transmit the ESD supplied from the outside as well as the driving power source and/or the driving signal to the inside of the display panel. The ESD transmitted to the inside of the display panel can cause the organic light emitting display to be defectively driven.

Therefore, a method of preventing the organic light emitting display from being defectively driven due to the ESD is desired.

SUMMARY OF THE INVENTION

Accordingly, embodiments of the present invention provide an organic light emitting display with an ESD protection circuit to prevent the display from being defectively driven.

According to one embodiment of the present invention, there is provided an organic light emitting display. The organic light emitting display includes a display unit including a plurality of pixels positioned at crossing regions between scan lines and data lines, a scan driver for supplying scan signals to the scan lines, a data driver for supplying data signals to the data lines, a pad unit, and a protective circuit unit. The pad unit includes a plurality of pads for transmitting driving power or driving signals to at least one of the display unit, the scan driver, or the data driver. The protective circuit unit is coupled between the pad unit and at least one of the display unit, the scan driver or the data driver. The protective circuit unit includes a semiconductor layer, insulating layers on the semiconductor layer and a conductive layer on the insulating layer. One region of the conductive layer that overlaps the semiconductor layer is physically disconnected to create two adjacent ends of the conductive layer. The two adjacent ends are coupled to each other through the semiconductor layer. The two adjacent ends of the disconnected conductive layer have recesses and protrusions. In some embodiments, the two adjacent ends may have a concavo-convex shape.

The two adjacent ends of the disconnected conductive layer may be concavo-convex in a plane, and a shortest distance between the two adjacent ends of the disconnected conductive layer may be between about 2 μm to about 10 μm.

In addition, the protective circuit unit may include resistance units, and each of the resistance units may include the semiconductor layer, insulating layers on the semiconductor layer, and the conductive layer on the insulating layers. The conductive layer may be electrically coupled with the semiconductor layer by contact holes.

In addition, the protective circuit unit may include diode-coupled transistors. Each of the diode-coupled transistors may include the semiconductor layer, a gate insulating layer on the semiconductor layer, a gate electrode on the gate insulating layer, an interlayer insulating layer on the gate electrode, and source and drain electrodes on the interlayer insulating layer. The source and drain electrodes may be electrically coupled with the semiconductor layer through contact holes. Here, at least one of the source and drain electrodes may be integrated with the conductive layer. In addition, adjacent and facing ends of the source and drain electrodes may have recesses and protrusions. In some embodiments, the adjacent and facing ends of the source and drain electrodes may have a concavo-convex shape.

In addition, the protective circuit unit may include resistance units electrically coupled with the pad unit and protective diodes electrically coupled between the resistance units and at least one of the display unit, the scan driver, or the data driver. Here, each of the protective diodes may include diode-coupled transistor.

In addition, the conductive layer may include a coupling wiring line that couples the pad unit to at least one of the display unit, the scan driver, or the data driver.

Another embodiment of the present invention provides an organic light emitting display. The organic light emitting display includes a display unit, a scan driver coupled to the display unit, a data driver coupled to the display unit, a pad unit and a protective circuit unit. The pad unit includes a plurality of pads for transmitting driving power or driving signals to at least one of the display unit, the scan driver, or the data driver. The protective circuit unit is coupled between the pad unit and at least one of the display unit, the scan driver or the data driver. The protective circuit unit includes a first ESD current path and a second ESD current path to protect the at least one of the display unit, the scan driver or the data driver from ESD damage. The second ESD current path is configured to protect the protective circuit unit when the protective circuit unit receives a voltage of ESD that is higher then a voltage limit of the first ESD current path.

The first current path may include a semiconductor layer, an insulating layer on the semiconductor layer, and a conductive layer on the insulating layer. A region of the conductive layer that overlaps the semiconductor layer is physically disconnected to create a gap. Two adjacent ends of the conductive layer on opposite ends of the gap are coupled to each other through the semiconductor layer, and the two adjacent ends have recesses and protrusions.

The second current path may be configured to carry current through the conductive layer and the gap by a tunneling phenomenon. The two adjacent ends of the conductive layer may have concavo-convex shape.

Still another embodiment of the present invention provides an ESD protective circuit unit. The ESD protective circuit unit includes a semiconductor layer, an insulating layer on the semiconductor layer, and a conductive layer on the insulating layer. One region of the conductive layer that overlaps the semiconductor layer is physically disconnected to create two adjacent ends of the conductive layer. The two adjacent ends are coupled to each other through the semiconductor layer, and the two adjacent ends have recesses and protrusions. In some embodiments, the two adjacent ends may have a concavo-convex shape.

The two adjacent ends of the disconnected conductive layer may be concavo-convex in a plane direction, and a shortest distance between the two adjacent ends may be between about 2 μm to about 10 μm.

BRIEF DESCRIPTION OF THE DRAWINGS

These and/or other embodiments and features of the invention will become apparent and more readily appreciated from the following description of certain exemplary embodiments, taken in conjunction with the accompanying drawings of which.

DETAILED DESCRIPTION OF EXEMPLARY EMBODIMENTS

Figure 1:
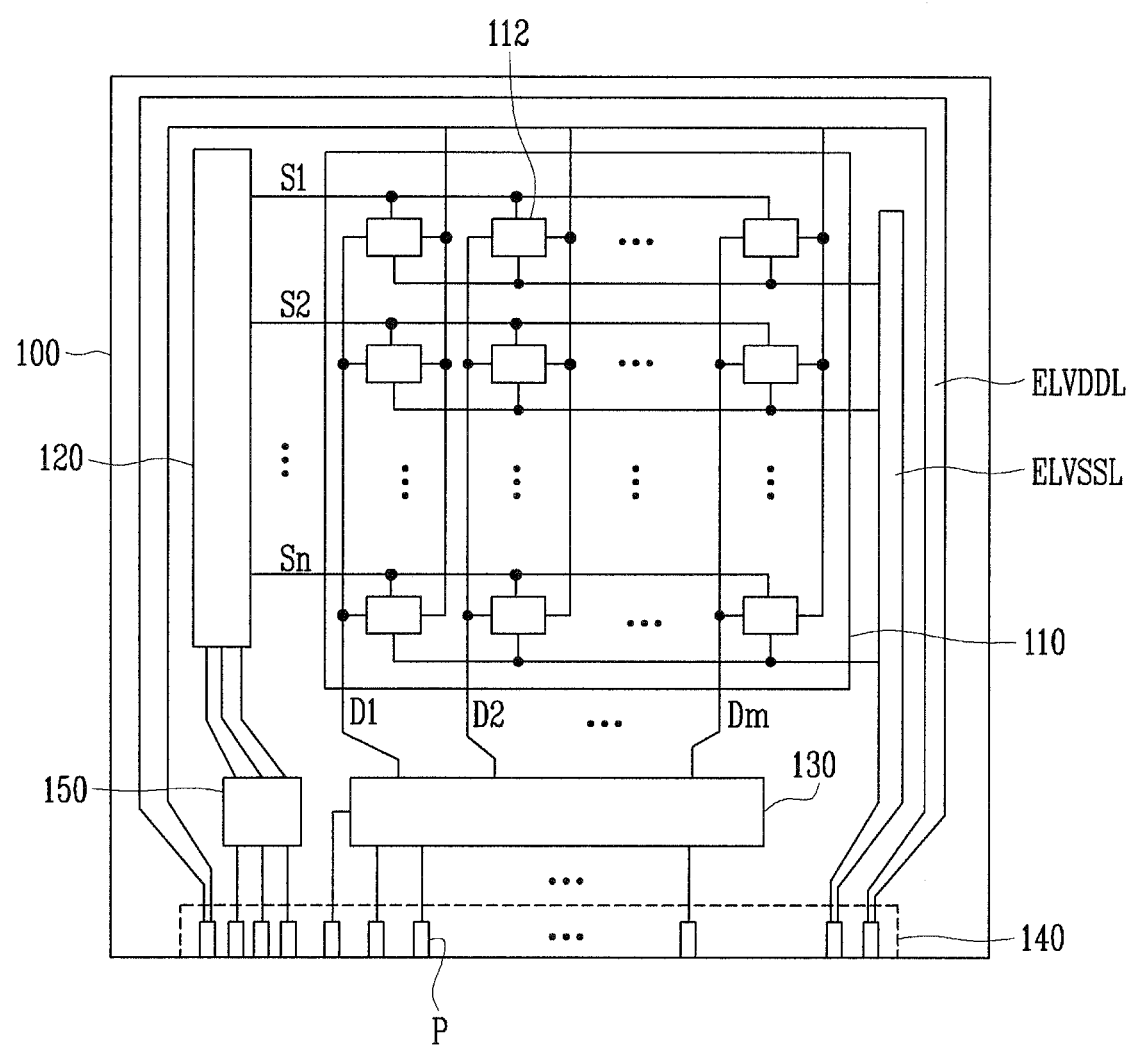
FIG. 1 is a block diagram illustrating the structure of an organic light emitting display according to an embodiment of the present invention.

Hereinafter, certain exemplary embodiments according to the present invention will be described with reference to the accompanying drawings. Here, when a first element is described as being coupled with a second element, the first element may be directly coupled with the second element or may be indirectly coupled with the second element via a third element. Further, elements that are not essential to the complete understanding of the invention are omitted for clarity. In addition, like reference numerals refer to like elements throughout.

Hereinafter, embodiments of the present invention will be described in detail with reference to the attached drawings.

FIG. 1 is a block diagram illustrating the structure of an organic light emitting display according to an embodiment of the present invention. For the sake of convenience, FIG. 1 illustrates the display panel of the organic light emitting display in which a display unit, a scan driver, a data driver, a pad unit, and a protective circuit unit are formed. However, the present invention is not limited to the above, and the structure of the display panel can vary.

Referring to FIG. 1, a display panel 100 of the organic light emitting display according to one embodiment of the present invention includes a display unit 110, a scan driver 120, a data driver 130, a pad unit 140, and a protective circuit unit 150.

The display unit 110 includes a plurality of pixels 112 positioned at the crossing regions of scan lines S1 to Sn and data lines D1 to Dm. The display unit 110 displays images that correspond to the scan signals and the data signals supplied from the scan lines S1 to Sn and the data lines D1 to Dm. Reference numerals ELVDDL and ELVSSL denote the supply lines of first and second pixel power sources ELVDD and ELVSS (not shown).

The scan driver 120 generates the scan signals that correspond to the scan driving power sources and the scan control signals transmitted from the pad unit 140. The scan signals generated from the scan driver 120 are sequentially supplied to the display unit 110 through the scan lines S1 to Sn.

The data driver 130 generates the data signals that correspond to the data and the data control signals transmitted from the pad unit 140. The data signals generated from the data driver 130 are supplied to the display unit 110 through the data lines D1 to Dm in synchronization with the scan signals.

The pad unit 140 is formed on one side of the display panel 100 and include a plurality of pads P that transmit the driving power sources and/or the driving signals to at least one of the display unit 110, the scan driver 120, the data driver 130, or the protective circuit unit 150. That is, the pads P are electrically coupled with the components (for example, the display unit 110, the scan driver 120, the data driver 130, and/or the protective circuit 150) formed in the display panel 100 through coupling wiring lines to supply the driving power sources and/or the driving signals to the components.

The protective circuit unit 150 is electrically coupled between the scan driver 120 and the pad unit 140. For example, the protective circuit unit 150 can be formed in the input lines (that is, coupling wiring lines between the scan driver 120 and the pad unit 140) of the scan driving power sources and/or the scan control signals (for example, the start pulses, the clock signals, and the output enable signals of the scan driver 120).

In one embodiment, the protective circuit unit 150 is shown only between the scan driver 120 and the pad unit 140 in FIG. 1 for convenience sake. However, the present invention is not limited to the above embodiment.

For example, the protective circuit unit 150 can be formed between the display unit 110 and/or the data driver 130, and the pad unit 140. That is, the protective circuit unit 150 is coupled with at least one of the display unit 110, the scan driver 120, or the data driver 130 and the pad unit 140. The protective circuit unit 150, in one embodiment, includes resistance units and/or protective diodes formed in at least one coupling wiring line. Therefore, the ESD received through the coupling wiring lines is dispersed or removed by the resistance units and/or the protective diodes to prevent the organic light emitting display from being defectively driven due to the ESD.

Figure 2:
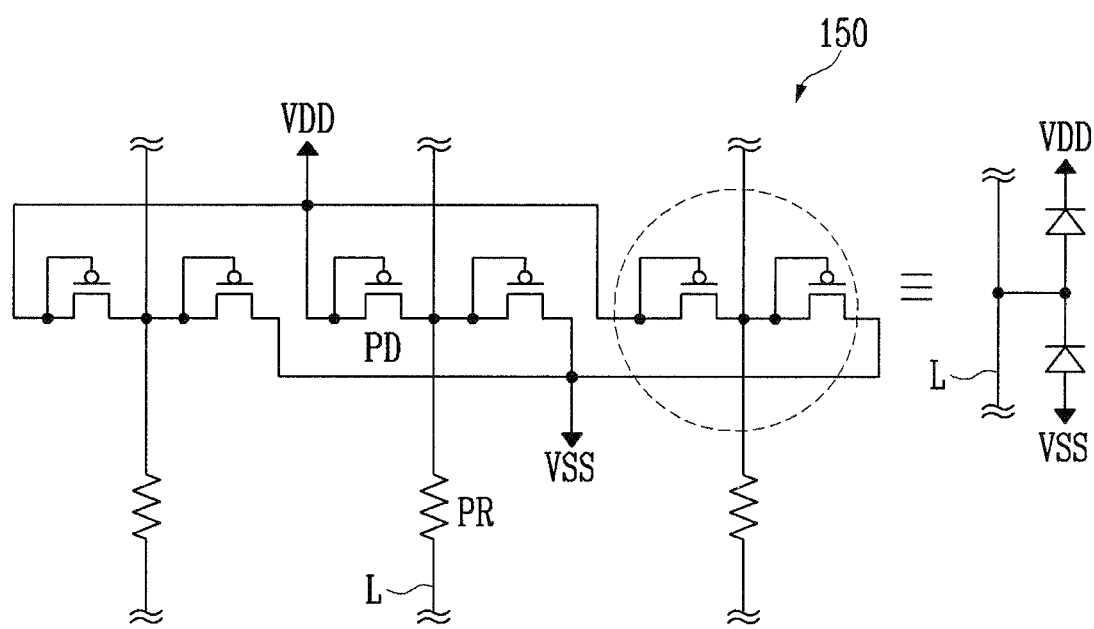
FIG. 2 is a schematic circuit diagram illustrating an example of a protecting circuit unit of FIG. 1.

FIG. 2 is a schematic circuit diagram illustrating an example of the protective circuit unit 150 of FIG. 1.

Referring to FIG. 2, the protective circuit 150 includes resistance units PR and protective diodes PD formed in the at least one coupling wiring lines L that couple the components respectively formed in the display panel 100 and the pad unit 140 with each other.

For example, the protective circuit unit 150 can include the resistance units PR that are electrically coupled with the pad unit 140 and the protective diodes PD that are electrically coupled either between the resistance units PR and the display unit 110 or between the scan driver 120 and the data driver 130.

Here, the protective diodes PD can be formed of diode coupled transistors. In addition, first and second scan driving power sources VDD and VSS or additional power sources can be used as reference power sources for driving the protective diodes PD.

For example, backward diode coupled transistors are coupled between the coupling wiring lines L and the first scan driving power source VDD and between the coupling wiring lines L and the second scan driving power source VSS to form the protective diodes PD.

In this case, when the ESDs have voltages of large values (that is, absolute values), the ESD having the positive (+) value is induced toward the first scan driving power source VDD, and the ESD having the negative (−) value is induced toward the second scan driving power source VSS so that the ESDs are not input to the other components formed in the display panel 100.

The resistance units PR and the protective diodes PD can be concurrently formed of the same material as the semiconductor layers and the source/drain electrodes of the transistors (hereinafter, referred to as pixel TFTs) (not shown) included in the display unit 110.

For example, the coupling wiring lines L can be formed of the same material as the source/drain electrodes of the pixel TFTs in the processes of forming the source/drain electrodes of the pixel TFTs. The resistance units PR can be formed so that one region of each of the coupling wiring lines L is physically disconnected, and that the electric coupling of the coupling wiring lines L is maintained through the semiconductor layers that is formed to overlap the disconnected parts of the coupling wiring lines L. Here, the semiconductor layers that form the resistance units PR can be formed of the same material as the semiconductor layers as the pixel TFTs or semiconductor material having higher doping density in the processes of forming the semiconductor layers of the pixel TFTs.

In addition, when the protective diodes PD are formed of the diode coupled transistors, the protective diodes PD can be formed of the same material as the pixel TFTs in the process of forming the pixel TFTs.

As described above, when the protective circuit unit 150 including the resistance units PR and the protective diodes PD is formed in the coupling wiring lines L between the components that are formed in the display panel 100 and the pad unit 140, the ESD received from the outside to the coupling wiring lines L is dispersed by the resistance units PR and is bypassed to the reference power sources through the protective diodes PD. Therefore, it is possible to prevent the components in the display panel 100 from being damaged by the ESD and to prevent the organic light emitting display from being defectively driven.

Figure 3A:
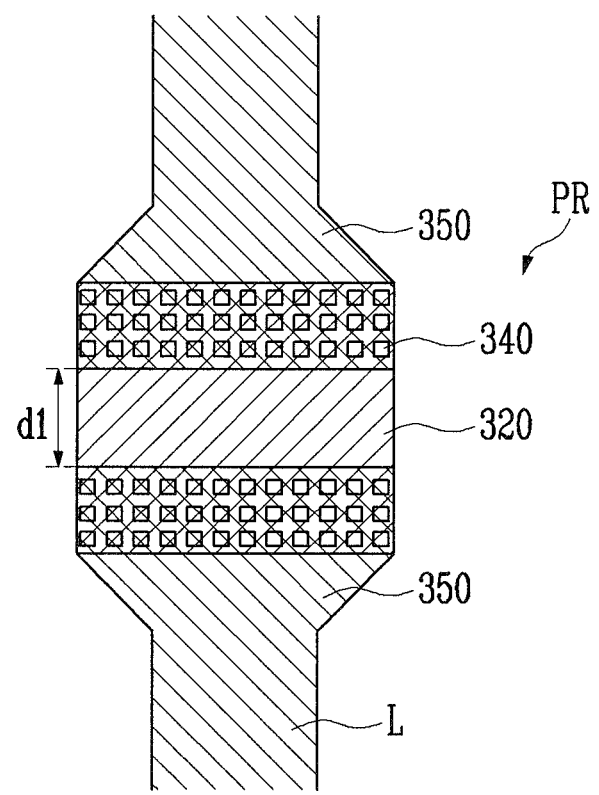
FIGS. 3A and 3B are a plan view and a sectional view of an example of a resistance unit of FIG. 2.
Figure 3B:
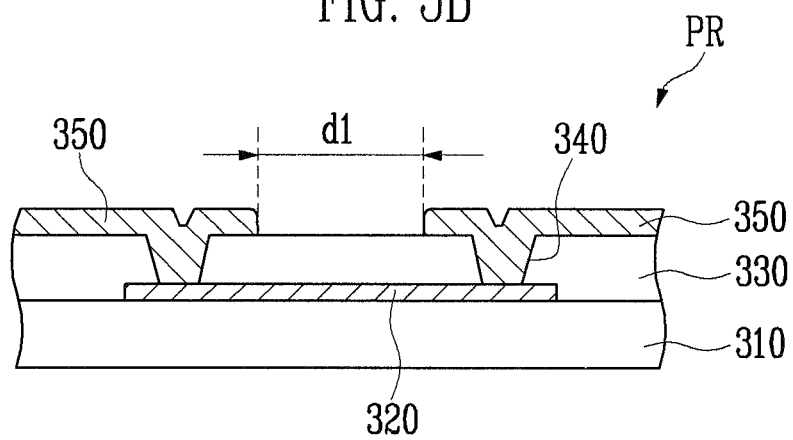

FIGS. 3A and 3B are a plan view and a sectional view of an example of the resistance unit PR of FIG. 2.

Referring to FIGS. 3A and 3B, the resistance unit PR illustrated in FIG. 2 can be formed so that one region of a conductive layer 350 that forms the coupling wiring line L is physically disconnected and that both disconnected ends of the conductive layer 350 are electrically coupled with a semiconductor layer 320 through contact holes 340.

In more detail, the resistance unit PR includes the semiconductor layer 320 that is formed on a substrate 310, insulating layers 330 that are formed on the semiconductor layer 320, and the conductive layer 350 that is formed on the insulating layers 330. Here, one region of the conductive layer 350 is physically disconnected by a distance of d1, and the disconnected ends of the conductive layer 350 are coupled with the semiconductor layer 320 through the contact holes 340. That is, the disconnected parts of the conductive layer 350 are electrically coupled through the semiconductor layer 320 so that the electric continuity of the coupling wiring lines L is maintained.

Here, the conductive layer 350 operates as the coupling wiring line L that couples at least one of the display unit 110, the scan driver 120, or the data driver 130 with the pad unit 140, and the semiconductor layer 320 that has a larger resistance value than the conductive layer 350 operates as the resistance unit PR.

The resistance units PR disperse the ESD input to the coupling wiring lines L to protect the other circuit units.

When the resistance unit PR receives an ESD having a voltage higher than that the resistance unit PR can handle, the semiconductor layer 320 of the resistance unit PR can be damaged.

As a result, since the driving power sources and/or the driving signals supplied from the pad unit 140 cannot be input to the display unit 110, the scan driver 120 and/or the data driver 130, the driving of the organic light emitting display can become defective.

Figure 4A:
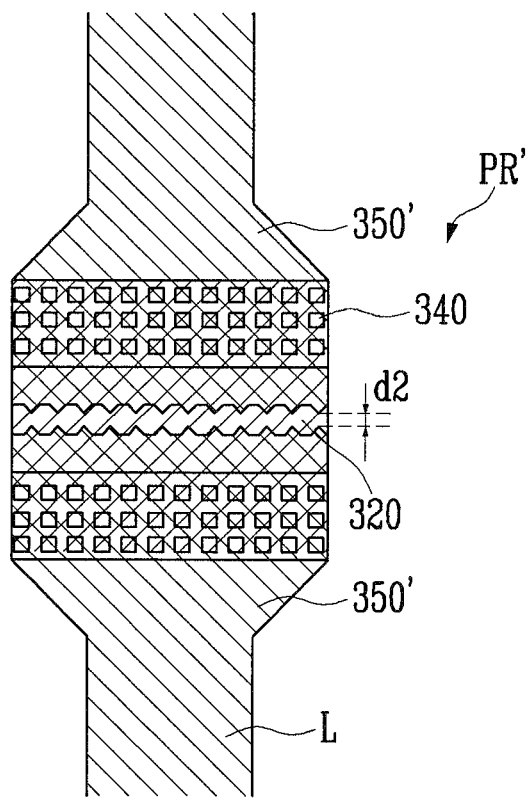
FIGS. 4A and 4B are a plan view and a sectional view of another example of the resistance unit of FIG. 2.
Figure 4B:
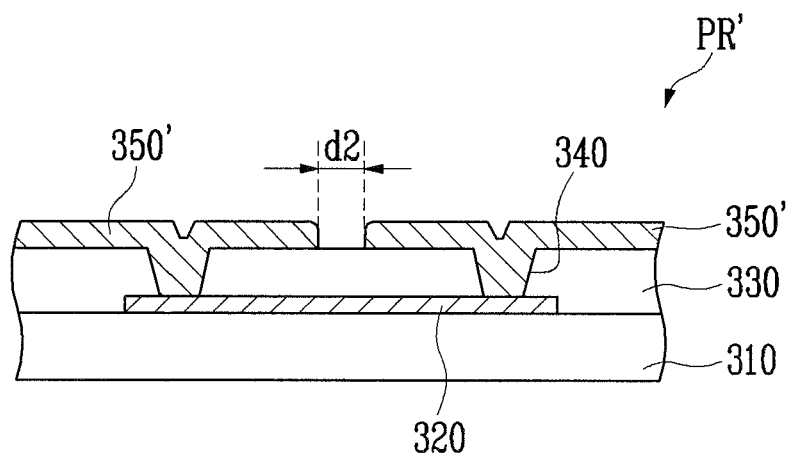

In order to prevent the defective driving of the organic light emitting display as described above, according to an embodiment of the present invention, another example of the resistance unit is illustrated in FIGS. 4A and 4B.

FIGS. 4A and 4B are a plan view and a sectional view of another example of the resistance unit of FIG. 2. In FIGS. 4A and 4B, the same components as the components of FIGS. 3A and 3B are denoted by the same reference numerals, and detailed description thereof will be omitted.

Referring to FIGS. 4A and 4B, the disconnected ends of a conductive layer 350' coupled with the semiconductor layer 320 have protrusions and recesses. In some embodiments the ends may be concavo-convex.

That is, in some embodiments, the adjacent disconnected ends of the conductive layer 350' are concavo-convex on a plane. The distance d2 by which the disconnected ends of the conductive layer 350' are separated is shorter than the distance d1 by which the disconnected ends of the conductive layer 350 (FIGS. 3A and 3B) are separated.

Therefore, when an ESD having a high voltage is received, the ESD does not pass through the semiconductor layer 320, instead the ESD directly flow through the gaps between the disconnected ends of the conductive layer 350' by tunneling. Thus damage to the semiconductor layer 320 caused by the ESD is prevented or reduced. Therefore, the driving power sources and/or the driving signals supplied from the pad unit 140 can be stably supplied to the inside of the display panel 100.

In the resistance unit PR' that has the above structure, the voltage range of the ESD that does not pass through the semiconductor layer 320 and that is bypassed to the conductive layer 350' can be controlled by controlling the distance d2 by which the disconnected ends of the conductive layer 350' are separated.

The shortest distance d2 by which the ends of the conductive layer 350' are separated from each other is properly set to prevent the semiconductor layer 320 from being damaged and broken in consideration of the characteristics of the semiconductor layer 320 or the voltage range of the received ESD. For example, the shortest distance d2 between the ends of the conductive layer 350' can be set to be 2 μm to 10 μm in some embodiments. This is because of, in the described embodiment, difficulties in processes and that short defect are easily generated when the shortest distance d2 is less than about 2 μm, and it is difficult to produce the tunneling effect between the ends of the conductive layer 350' when the shortest distance d2 is more than about 10 μm.

However, the present invention is not limited to the above described embodiments, and the shortest distance d2 between the ends of the conductive layer 350' can be set to various distances to prevent or reduce the semiconductor layer 320 from being damaged and be broken in consideration of the characteristics of the semiconductor layer 320 or the voltage range of the received ESD.

Figure 4C:
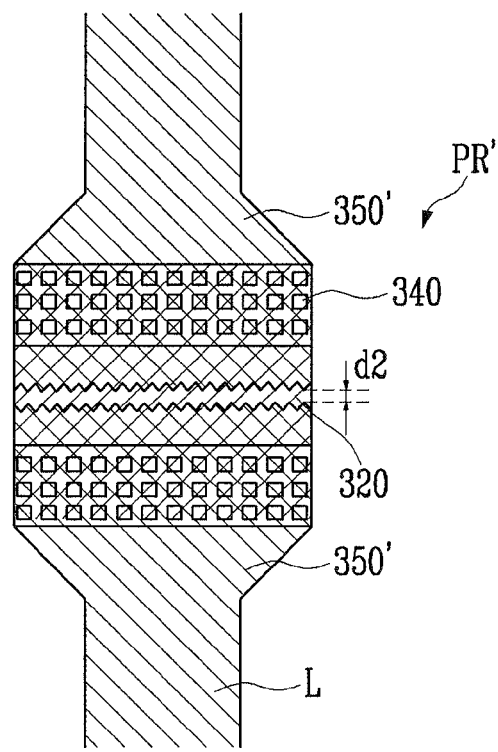
FIGS. 4C and 4D are plan views of still another example of the resistance unit of FIG. 2.
Figure 4D:
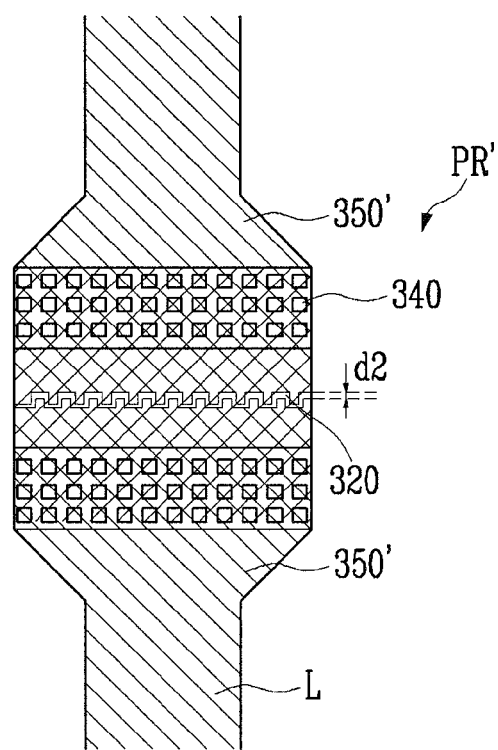

On the other hand, the shape of the disconnected ends of the conductive layer 350' is not limited to the shape illustrated in FIG. 4A. For example, the disconnected ends of the conductive layer 350' can be triangular tooth shaped as illustrated in FIG. 4C or can be rectangular as illustrated in FIG. 4D.

That is, according to various embodiments of the present invention, the shapes of the disconnected ends of the conductive layer 350' are not limited to a specific shape but can be variously set to any shape that can allow the ESD to tunnel.

Figure 5A:
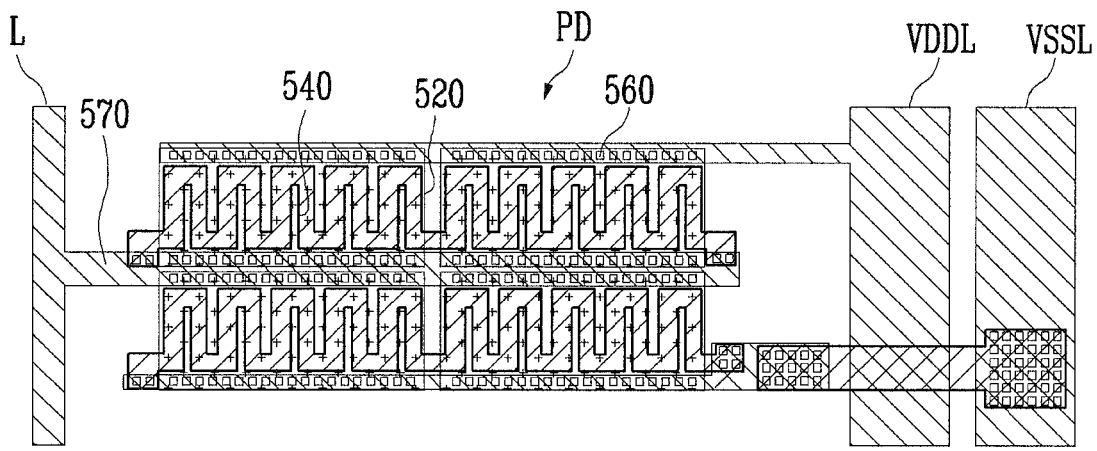
FIG. 5A is a plan view of an example of a protective diode of FIG. 2.
Figure 5B:
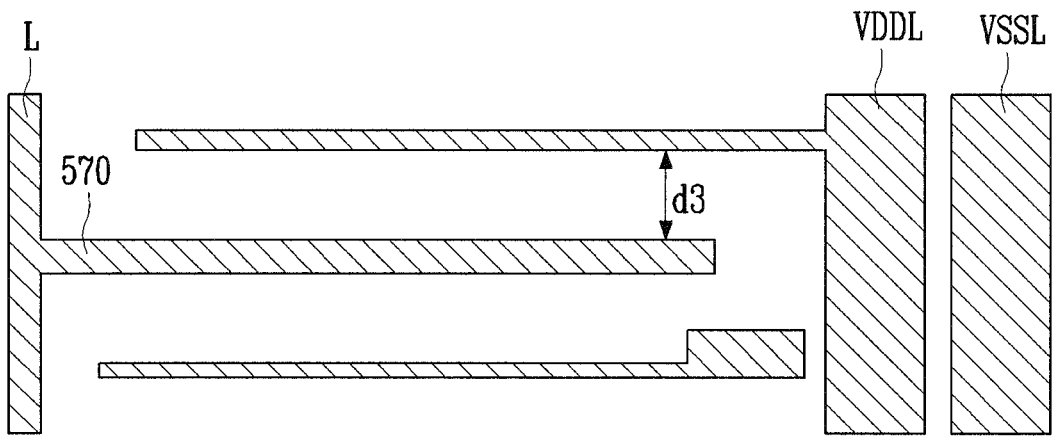
FIG. 5B is a plan view of the coupling wiring lines, the input lines of the first and second scan driving power sources and the source/drain electrodes of the protective diode of FIG. 5A.
Figure 5C:
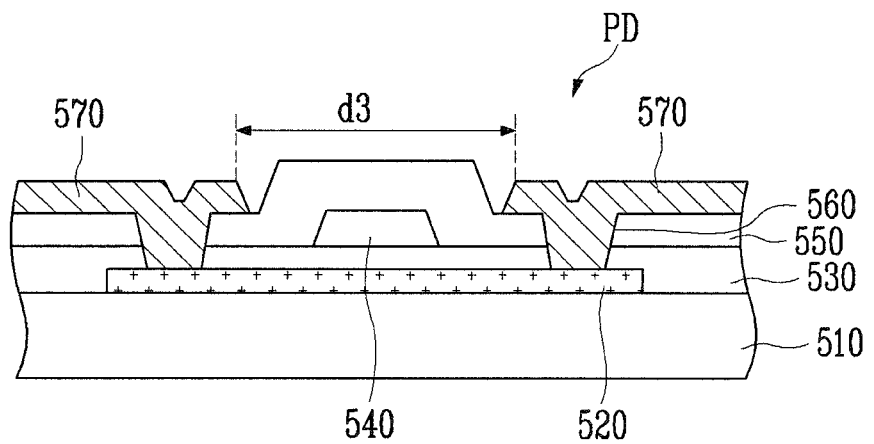
FIG. 5C is a sectional view of an example of the protective diode of FIG. 2.

FIG. 5A is a plan view of the exemplary protective diode PD of FIG. 2. FIG. 5B is a plan view of the coupling wiring lines L, the input lines of the first and second scan driving power sources, and the source/drain electrodes of the protective diode PD of FIG. 5A. FIG. 5C is a sectional view illustrating an example of the protective diode PD of FIG. 2. Referring to FIGS. 5A to 5C, the protective diode PD is formed between the coupling wiring line L and the input line (hereinafter, referred to as VDDL) of the first scan driving power source and between the coupling wiring line L and the input line (hereinafter, referred to as VSSL) of the second scan driving power source.

In more detail, the protective diode PD includes a transistor backward (forward when the positive ESD is input) diode coupled between the coupling wiring line L and the VDDL and a transistor backward (forward when the negative ESD is input) diode coupled between the coupling wiring line L and the VSSL.

Here, the coupling wiring line L, the VDDL, the VSSL, and source/drain electrodes 570 can be formed of the same material in the same processes.

That is, the source or drain electrode 570 of the transistor that forms the protective diode PD can be integrated with the conductive layer that forms the coupling wiring line L, the VDDL, or the VSSL. A conductive layer is physically disconnected by a predetermined distance d3 between the source and drain electrodes 570 of the transistor so that the source and drain electrodes 570 are coupled to each other with a semiconductor layer 520 through contact holes 560.

The protective diode PD induces the ESD input through the coupling wiring line L to the reference power source (for example, the first or second scan driving power source VDD or VSS) to protect the other circuit units. More detail of the section of the protective diode PD will be described. The protective diode PD includes the transistor consisting of a semiconductor layer 520 formed on a substrate 510, gate insulating layers 530 formed on the semiconductor layer 520, a gate electrode 540 formed on the gate insulating layers 530, interlayer insulating layers 550 formed on the gate electrode 540, and the source/drain electrodes 570 formed on the interlayer insulating layers 550 to be electrically coupled with the semiconductor layer 520 by contact holes 560. Here, although not shown in FIG. 5C, the gate electrode 540 of the transistor is coupled with the source or drain electrode 570 to be diode coupled.

On the other hand, the source and drain electrodes 570 of the transistor that forms the protective diode PD are separated from each other by the distance d3 so that the ESD flows between the source electrode 570 and the drain electrode 570 via the semiconductor layer 520.

However, when the protective diode PD receives an ESD having a voltage higher than that the semiconductor layer 520 can handle, the semiconductor layer 520 can be damaged and be broken. In this case, the protective diode PD cannot perform a proper function.

Figure 6A:
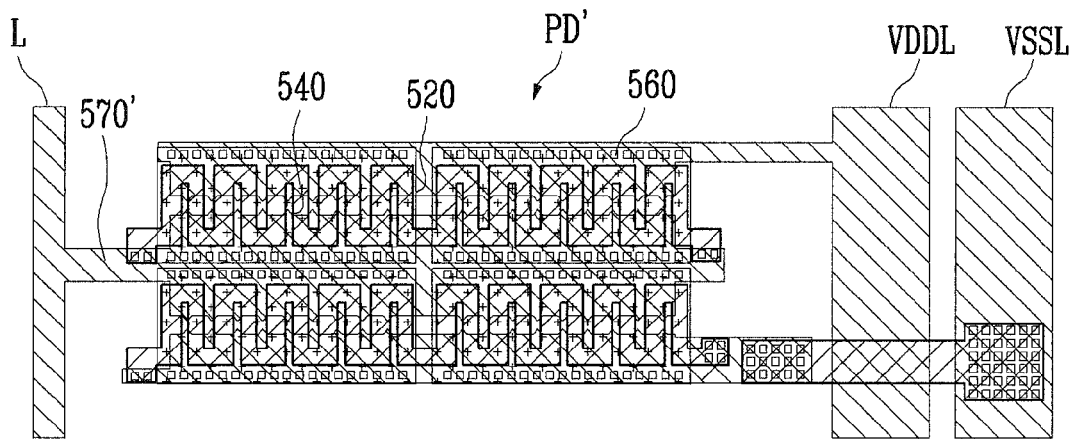
FIG. 6A is a plan view of another example of the protective diode of FIG. 2.
Figure 6B:
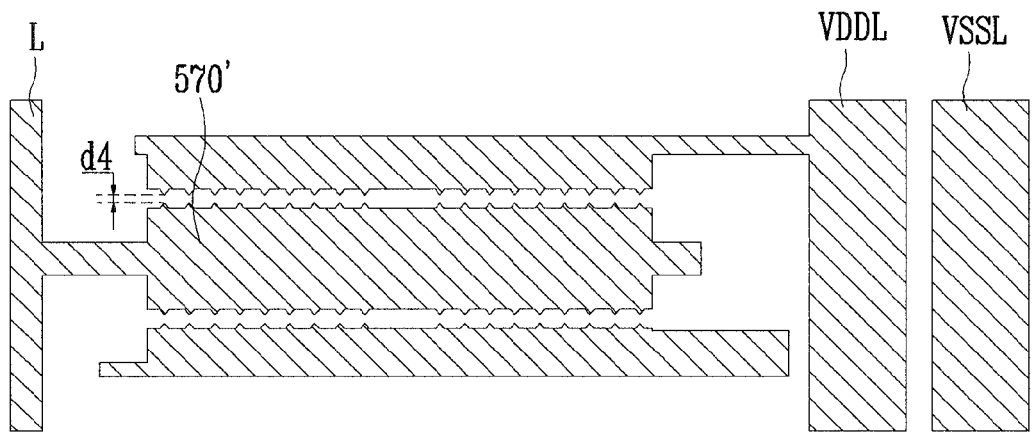
FIG. 6B is a plan view of the coupling wiring lines, the input lines of the first and second scan driving power sources, and the source/drain electrodes of the protective diode of FIG. 6A.
Figure 6C:
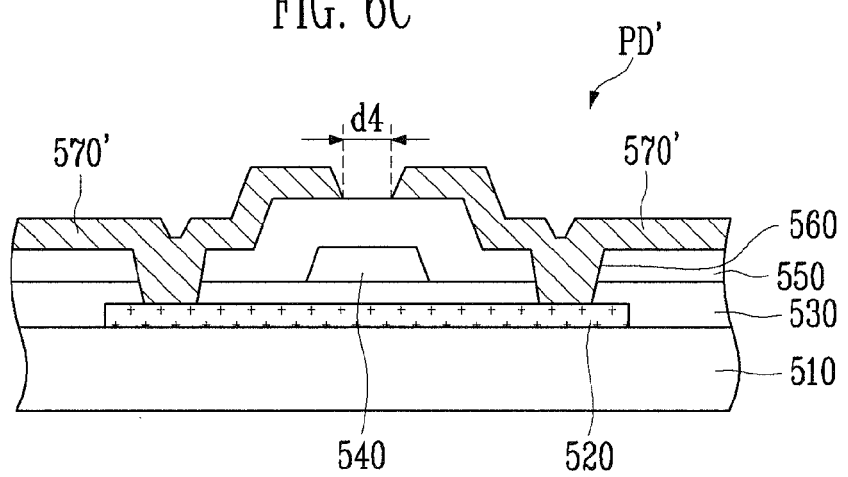
FIG. 6C is a sectional view of another example of the protective diode of FIG. 2.

In order to prevent the semiconductor layer 520 from being damaged, according to another embodiment of the present invention, another example of the protective diode PD' illustrated in FIGS. 6A to 6C will be provided.

FIG. 6A is a plan view of the protective diode of FIG. 2. FIG. 6B is a plan view of the coupling wiring lines L, the input lines of the first and second scan driving power sources, and the source/drain electrodes of the protective diode PD' of FIG. 6A. FIG. 6C is a sectional view of another exemplary embodiment of the protective diode of FIG. 2. In FIGS. 6A to 6C, the same components as the components of FIGS. 5A to 5C are denoted by the same reference numerals and detailed description thereof will be omitted.

Referring to FIGS. 6A to 6C, both ends of source and drain electrodes 570' have recesses and protrusions. In some embodiments the ends may be concavo-convex. That is, in one embodiment, the adjacent and facing ends of the source and drain electrodes 570' may be concavo-convex on a plane. The distance d4 by which the source and drain electrodes 570' are separated from each other is formed to be shorter than the distance d3 by which the source and drain electrodes 570 illustrated in FIGS. 5A to 5C are separated from each other.

Therefore, when an ESD having a high voltage is received, the ESD does not pass through the semiconductor layer 520, instead the ESD directly flows to the source and drain electrodes 570' by a tunneling phenomenon. Thus the semiconductor layer 520 is prevented from being damaged. Therefore, a protective diode PD' can continuously perform a function of protecting the other components in the display panel 100.

In the protective diode PD' having the above described structure, the voltage range of the ESD that does not pass through the semiconductor layer 520 and that directly flows to the source and drain electrodes 570' can be controlled by controlling the distance d4 between the source and drain electrodes 570'.

That is, the distance d4 between the source and drain electrodes 570' can be properly set to prevent the semiconductor layer 520 from being damaged in consideration of the characteristics of the semiconductor layer 520 or the voltage range of the received ESD. For example, the shortest distance d4 between the source and drain electrodes 570' can be set to be 2 μm to 10 μm, in some embodiments. This is because difficulties in processes and short defect are easily generated when the shortest distance d4 is less than about 2 μm, and it is difficult to produce the tunneling effect between the source and drain electrodes 570' when the shortest distance d4 is more than about 10 μm.

However, the present invention is not limited to the above described embodiments, and the shortest distance d4 between the source and drain electrodes 570' can be variously set to prevent the semiconductor layer 520 from being damaged and broken in consideration of the characteristics of the semiconductor layer 520 or the voltage range of the received ESD.

On the other hand, the shape of the ends of the source and drain electrodes 570' is not limited to the shape illustrated in FIGS. 6A and 6B. For example, the ends of the source and drain electrodes 570' can be triangular tooth shaped or rectangular.

That is, according to the embodiments of the present invention, the shapes of the ends of the source and drain electrodes' are not limited to a specific shape but can be variously set to any shape that can allow the ESD to tunnel.

As described above, according to the embodiments of the present invention, the protective circuit unit is formed between at least one of the display unit, the scan driver, or the data driver formed on the display panel and the pad unit to prevent the organic light emitting display from being defectively driven due to the ESD received from the outside of the organic light emitting display.

In addition, the disconnected parts of the conductive layer formed in the protective circuit unit have recesses and protrusions (e.g., concavo-convex), and one region of the conductive layer is physically disconnected so that the disconnected parts of the conductive layer are coupled with each other through the semiconductor layer. Therefore, ESD having a high voltage that can cause damage to the semiconductor layer can be induced not to pass through the semiconductor layer but to flow only through the conductive layer. As a result, the semiconductor layer is prevented or reduced from being damaged so that the driving power sources and/or the driving signals supplied from the pad unit can be stably supplied to the inside of the display panel.

In addition, the distance between the disconnected ends of the conductive layer formed in the protective circuit can be controlled to control the voltage range of the ESD at which the ESD does not pass through the semiconductor layer.

According to the embodiments of the present invention, the protective circuit unit provides two ESD paths: a first ESD current path and a second ESD current path to protect the at least one of the display unit, the scan driver or the data driver from ESD damage. For example, the first ESD path includes the conductive layer and the semiconductor layer, and the second ESD path does not include the semiconductor layer. The second ESD current path protects the components of the protective circuit unit (e.g., the semiconductor layer) when the protective circuit unit receives a voltage of ESD that is higher then a voltage limit of the first ESD current path.

Although exemplary embodiments of the present invention have been shown and described, it would be appreciated by those skilled in the art that changes might be made to these embodiments without departing from the principles and spirit of the invention, the scope of which is defined in the claims and their equivalents.

What is claimed is:

1. An organic light emitting display comprising:
    a display unit comprising a plurality of pixels positioned at crossing regions between a plurality of scan lines and a plurality of data lines;
    a scan driver for supplying scan signals to the plurality of scan lines;
    a data driver for supplying data signals to the plurality of data lines;
    a pad unit comprising a plurality of pads for transmitting driving power and driving signals to at least one of the display unit, the scan driver, or the data driver;
    a protective circuit unit coupled between at least one of the display unit, the scan driver or the data driver, and the pad unit;
    a driving power line for transmitting the driving power from the pad unit to the display unit, the scan driver, or the data driver via the protective circuit; and
    a driving signal line for transmitting one of the driving signals from the pad unit to the display unit, the scan driver, or the data driver via the protective circuit,
    wherein the protective circuit unit comprises at least one transistor comprising a gate electrode, a semiconductor layer, an insulating layer on the semiconductor layer, and a conductive layer on the insulating layer,
    wherein one region of the conductive layer that overlaps the semiconductor layer is physically disconnected to create two adjacent ends of the conductive layer, the two adjacent ends coupled to each other through the semiconductor layer, the two adjacent ends having first edges that face each other, the driving power line comprising the gate electrode and one of the two adjacent ends, the driving signal line comprising another of the two adjacent ends, and
    wherein the first edges of the disconnected conductive layer have recesses and protrusions.

2. The organic light emitting display as claimed in claim 1, wherein the first edges of the disconnected conductive layer have a concavo-convex shape.

3. The organic light emitting display as claimed in claim 1,
    wherein the first edges of the disconnected conductive layer are concavo-convex in a plane, and
    wherein a shortest distance between the first edges of the disconnected conductive layer is between about 2 μm to about 10 μm.

4. The organic light emitting display as claimed in claim 1,
    wherein the protective circuit unit further comprises a plurality of resistance units, and
    wherein each of the resistance units comprises:
        the semiconductor layer;
        the insulating layer on the semiconductor layer; and
        the conductive layer on the insulating layer, the conductive layer electrically coupled with the semiconductor layer by a plurality of contact holes.

5. The organic light emitting display as claimed in claim 1,
    wherein the at least one transistor comprises a plurality of diode-coupled transistors, and
    wherein each of the plurality of diode-coupled transistors comprises:
        the semiconductor layer;
        a gate insulating layer on the semiconductor layer;
        a corresponding gate electrode on the gate insulating layer;
        an interlayer insulating layer on the corresponding gate electrode; and source and drain electrodes on the interlayer insulating layer, the source and drain electrodes electrically coupled with the semiconductor layer through contact holes.

6. The organic light emitting display as claimed in claim 5, wherein at least one of the source and drain electrodes is integrated with the conductive layer.

7. The organic light emitting display as claimed in claim 5, wherein adjacent and facing ends of the source and drain electrodes have recesses and protrusions.

8. The organic light emitting display as claimed in claim 7, wherein adjacent and facing ends of the source and drain electrodes have a concavo-convex shape.

9. The organic light emitting display as claimed in claim 1, wherein
the protective circuit unit further comprises a plurality of resistance units electrically coupled with the pad unit, and
the at least one transistor comprises a plurality of diode-coupled transistors electrically coupled between the resistance units and at least one of the display unit, the scan driver, or the data driver.

10. The organic light emitting display as claimed in claim 1, wherein the conductive layer comprises a coupling wiring line that couples at least one of the display unit, the scan driver, or the data driver with the pad unit.

11. An organic light emitting display comprising:
a display unit;
a scan driver coupled to the display unit;
a data driver coupled to the display unit;
a pad unit comprising a plurality of pads for transmitting driving power and driving signals to at least one of the display unit, the scan driver, or the data driver;
a protective circuit unit coupled between the pad unit and at least one of the display unit, the scan driver, or the data drive;
a driving power line for transmitting the driving power from the pad unit to the display unit, the scan driver, or the data driver via the protective circuit; and
a driving signal line for transmitting one of the driving signals from the pad unit to the display unit, the scan driver, or the data driver via the protective circuit,
wherein the protective circuit unit comprises a first electrostatic discharge (ESD) current path and a second ESD current path to protect the at least one of the display unit, the scan driver or the data driver from an ESD damage,
wherein the first ESD current path comprises at least one transistor comprising a gate electrode, a semiconductor layer, an insulating layer on the semiconductor layer, and a conductive layer on the insulating layer,
wherein a region of the conductive layer that overlaps the semiconductor layer is physically disconnected to create a gap, two adjacent ends of the conductive layer on opposite ends of the gap coupled to each other through the semiconductor layer, the two adjacent ends having first edges that face each other, the driving power line comprising one of the two adjacent ends, the driving signal line comprising the gate electrode and another of the two adjacent ends,
wherein the first edges have recesses and protrusions, and
wherein the second ESD current path is configured to protect the protective circuit unit when the protective circuit unit receives a voltage of ESD that is higher than a voltage limit of the first ESD current path.

12. The organic light emitting display as claimed in claim 11, wherein the second current path is configured to carry current through the conductive layer and the gap by a tunneling phenomenon.

13. The organic light emitting display as claimed in claim 11, wherein the first edges of the conductive layer have a concavo-convex shape.

14. An electrostatic discharge (ESD) protective circuit unit for directing ESD from a driving signal line for transmitting a driving signal, to a driving power line for transmitting a driving power, the ESD protective circuit unit comprising:
at least one transistor comprising:
a gate electrode;
a semiconductor layer;
an insulating layer on the semiconductor layer; and
a conductive layer on the insulating layer,
wherein one region of the conductive layer that overlaps the semiconductor layer is physically disconnected to create two adjacent ends of the conductive layer, the two adjacent ends coupled to each other through the semiconductor layer, the two adjacent ends having first edges that face each other,
wherein the at least one transistor is configured to couple to the driving signal line and the driving power line such that the driving power line comprises the gate electrode and one of the two adjacent ends, and the driving signal line comprises another of the two adjacent ends, and
wherein the first edges of the disconnected conductive layer have recesses and protrusions.

15. The ESD protective circuit unit as claimed in claim 14, wherein the first edges of the disconnected conductive layer have a concavo-convex shape.

16. The ESD protective circuit unit as claimed in claim 14, wherein the first edges of the disconnected conductive layer are concavo-convex in a plane, and
wherein a shortest distance between the first edges of the disconnected conductive layer is between about 2 μm to about 10 μm.

* * * * *

UNITED STATES PATENT AND TRADEMARK OFFICE
CERTIFICATE OF CORRECTION

| | | |
|---|---|---|
| PATENT NO. | : 8,665,191 B2 | Page 1 of 1 |
| APPLICATION NO. | : 12/173085 | |
| DATED | : March 4, 2014 | |
| INVENTOR(S) | : Won-Kyu Kwak | |

It is certified that error appears in the above-identified patent and that said Letters Patent is hereby corrected as shown below:

In the Claims

Column 11, line 36, Claim 11        Delete "drive,"

Insert -- driver; --

Signed and Sealed this
First Day of March, 2016

Michelle K. Lee
*Director of the United States Patent and Trademark Office*